United States Patent
Nicolas

(10) Patent No.: US 8,027,394 B2
(45) Date of Patent: Sep. 27, 2011

(54) REDUCING DATA STREAM JITTER DURING DEINTERLEAVING

(75) Inventor: Frederić Nicolas, Acigne (FR)

(73) Assignee: Silicon Laboratories Inc., Austin, TX (US)

( * ) Notice: Subject to any disclaimer, the term of this patent is extended or adjusted under 35 U.S.C. 154(b) by 987 days.

(21) Appl. No.: 11/903,910

(22) Filed: Sep. 25, 2007

(65) Prior Publication Data

US 2009/0080545 A1     Mar. 26, 2009

(51) Int. Cl.
- *H04K 1/00* (2006.01)
- *H04L 25/40* (2006.01)
- *G06F 13/00* (2006.01)
- *G11C 29/00* (2006.01)

(52) U.S. Cl. ......... 375/260; 375/372; 711/157; 714/805

(58) Field of Classification Search .................. 375/260, 375/262, 265, 340, 341, 372, 376; 711/100, 711/157, 211, 217, 218; 713/503; 714/700, 714/702, 728, 794, 795, 798, 730, 731, 739, 714/743, 744, 758, 789, 790, 800, 802–805

See application file for complete search history.

(56) References Cited

U.S. PATENT DOCUMENTS

| | | | |
|---|---|---|---|
| 5,535,220 A * | 7/1996 | Kanno et al. | 714/701 |
| 6,625,234 B1 * | 9/2003 | Cui et al. | 375/341 |
| 6,687,315 B2 | 2/2004 | Keevill et al. | 375/341 |
| 6,721,908 B1 * | 4/2004 | Kim et al. | 714/702 |
| 7,170,849 B1 * | 1/2007 | Arivoli et al. | 370/208 |
| 7,426,240 B2 * | 9/2008 | Peron | 375/260 |
| 7,440,392 B2 * | 10/2008 | Hwang et al. | 370/208 |
| 2004/0123226 A1 * | 6/2004 | Lee et al. | 714/790 |

OTHER PUBLICATIONS

European Broadcasting Union, European Standard (Telecommunications series), "Digital Video Broadcasting (DVB); Framing structure, channel coding and modulation for digital terrestrial television," 2004, pp. 1-64.

Silicon Laboratories, "SiRX™ Single-Chip RF Front-End for Digital Satellite TV," Nov. 2005, pp. 1-10.

Silicon Laboratories, "Si2107/08/09/10," Jun. 2006, pp. 21-28.

* cited by examiner

*Primary Examiner* — Young T. Tse

(74) *Attorney, Agent, or Firm* — Trop, Pruner & Hu, P.C.

(57) ABSTRACT

In one embodiment, the present invention includes a deinterleaver having an input interface to receive orthogonal frequency division multiplexing (OFDM) symbols from a demodulator, a memory coupled to the input interface to store the OFDM symbols, an output interface coupled to the memory to receive the OFDM symbols stored in the memory, and a digital phase lock loop (PLL) to control and adjust a reading rate of data from the memory responsive to dynamic and static channel conditions.

23 Claims, 7 Drawing Sheets

REDUCING DATA STREAM JITTER DURING DEINTERLEAVING

BACKGROUND

A digital video broadcasting (DVB) receiver receives incoming signals from a selected source, such as a broadcast source, e.g., terrestrial or other such source. After tuning to a desired channel, incoming data is demodulated to obtain signal information, such as in accordance with a given MPEG standard. Oftentimes, the data is modulated using orthogonal frequency division multiplexing (OFDM). Typically, a receiver includes a front end including a tuner section, which receives and tunes to a desired channel. The incoming signal is then converted to a digital data stream, which is provided to a demodulator. Oftentimes, the demodulator output is provided to forward error correction (FEC) circuitry to handle errors present in the data stream. The data stream provided by the demodulator to the FEC circuitry can be quite jittered because of the structure of the OFDM symbol in the frequency and time domains.

In the frequency domain, synchronization and signalization carriers are regularly spread in between data carriers, and null carriers are put on the edges of the fast Fourier transform (FFT) window so that the spectrum remains in the available channel bandwidth. In the time domain, the guard interval creates a temporal burst, which could last up to a quarter of the OFDM symbol total duration. In addition, time synchronization might also involve sudden jumps of the FFT window start signal due to apparition or disappearing of echoes. These jumps can practically range between +/- guard interval duration. As a result, the total guard interval duration between OFDM symbols becomes dynamic, ranging from zero to up to twice the guard interval.

Despite this variation, the output data stream provided from the demodulator to other receiver circuitry such as an audio-video decoder, should have minimal jitter. Some systems provide for byte rate smoothing at a rear end of FEC circuitry. This requires additional hardware and raises complexity of processing. Specifically, an extra memory is needed at the backend of the FEC circuitry to absorb all prior bursts related to demodulation parameters and synchronization. As described above, such bursts can last up to twice the guard interval time period, and this additional memory consumes additional chip real estate. Furthermore, the entire FEC circuitry suffers from this jitter prior to this output-based byte rate smoothing.

Other known techniques provide for static data stream smoothing. However, such static jitter correction is implemented typically for a worst case scenario. Under this type of correction, there is always a gap to absorb, particularly when the guard interval is relatively large with respect to the number of FFT demodulator carriers. Furthermore, under dynamic channel conditions such as apparition of a pre-echo, part of the data carriers may be temporarily lost, causing a burst of erroneous packets at the output of the FEC circuitry.

SUMMARY OF THE INVENTION

According to one aspect, the present invention includes a deinterleaver to perform jitter control on incoming symbol data so that other Forward Error Correction (FEC) circuitry can operate on rate-smoothed data. Such a deinterleaver may include an input interface to receive orthogonal frequency division multiplexing (OFDM) symbols from a demodulator, a memory coupled to the input interface to store the OFDM symbols, an output interface coupled to the memory to receive the OFDM symbols stored in the memory, and a digital phase lock loop (PLL) coupled to the input interface and the output interface. The digital PLL may control and adjust a reading rate of data from the memory responsive to dynamic and static channel conditions of a channel that transmits the OFDM symbols. In this way, the digital PLL can control the output jitter to less than half of a carrier clock cycle under a static channel state, as well as to dynamically adapt the reading rate under dynamic channel conditions, such as to absorb a fast Fourier transform (FFT) window jump.

Another aspect of the present invention is directed to a method for controlling read and write operations for a deinterleaver memory. More specifically, the method may be used to write symbol data of a first parity into the memory using sequential addressing and write symbol data of a second parity into the memory using pseudo random addressing. Conversely, the symbol data of the first parity may be read from the memory using pseudo random addressing and symbol data of the second parity read from the memory using sequential addressing. In this way, read and write operations can occur asynchronously.

Yet another aspect of the present invention is directed to a system having a tuner to receive a radio frequency (RF) signal from a signal source, and downconvert the RF signal to a second frequency to extract a signal channel, a demodulator coupled to the tuner to demodulate the signal channel, and a FEC circuit coupled to the demodulator to receive the demodulated signal channel and to generate a transport stream therefrom. The FEC circuit may perform jitter control in a front end stage, which is coupled to a decoding stage that in turn is coupled to a back end stage. The front end stage may include a PLL coupled to a memory to store demodulated symbol data and to control and adjust a reading rate from the memory responsive to dynamic and static channel conditions of the system. The system may further include a processor coupled to the FEC circuit to receive the transport stream and to process the transport stream to obtain audio visual data.

DETAILED DESCRIPTION

Embodiments provide techniques to smooth the data rate at which a data stream is provided to certain receiver circuitry.

More specifically, control mechanisms at a Forward Error Correction input can take into account potential variations in guard interval duration, among other system considerations. Embodiments may be implemented in conjunction with inner OFDM symbol deinterleaving, optimizing usage of the memory used for that part of the decoding. As a result, data stream jitter is reduced to its minimum as soon as possible, eliminating the need for any additional buffering in the FEC path.

Figure 1:
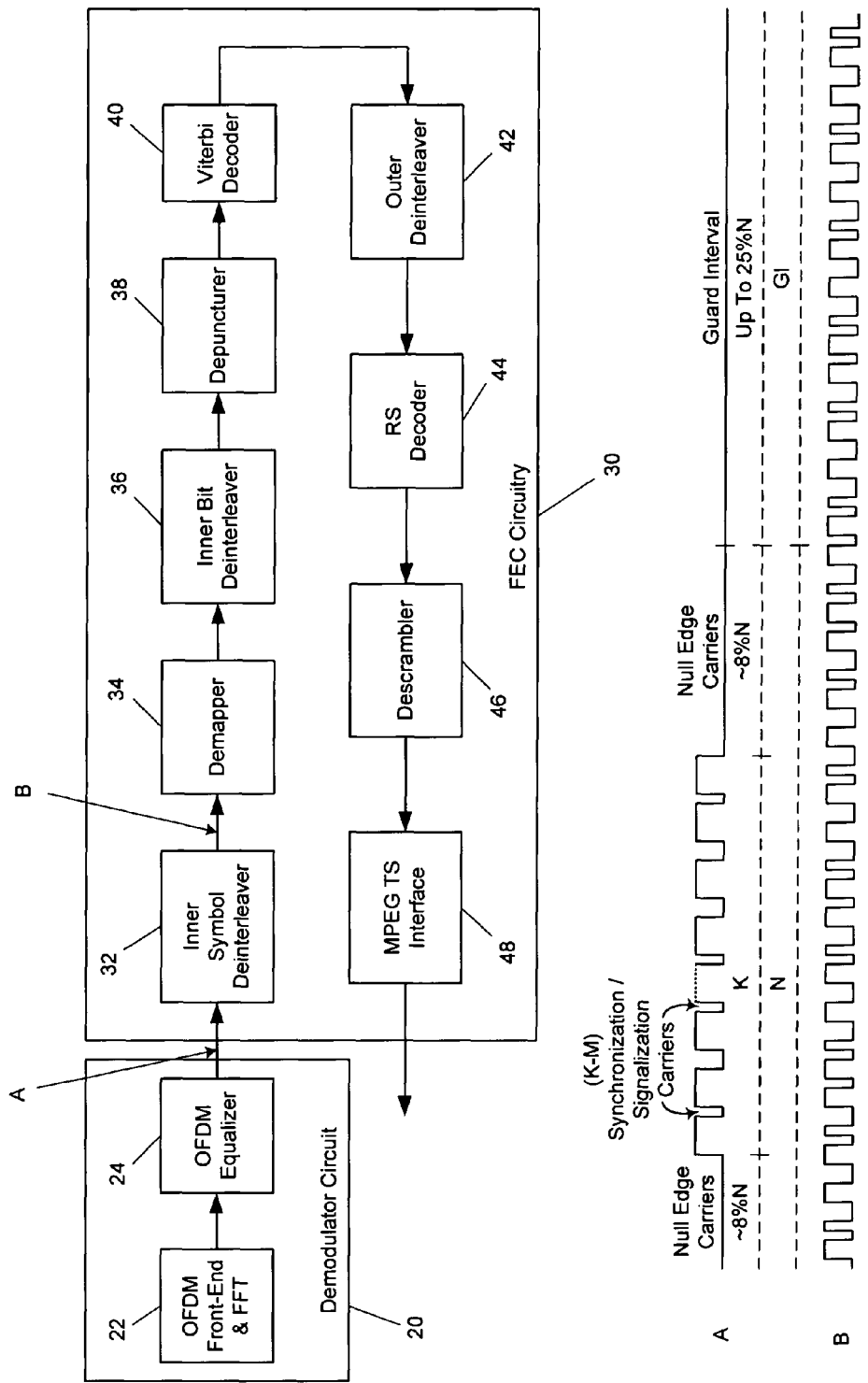
FIG. 1 is a block diagram of a portion of a receiver in accordance with one embodiment of the present invention.

Referring now to FIG. 1, shown is a block diagram of a portion of a receiver in accordance with one embodiment of the present invention. As shown in FIG. 1, demodulation circuitry 20 and FEC circuitry 30 of a receiver 10 are present. Understand that while shown with these limited components in the embodiment of FIG. 1, a receiver may include further circuitry including gain control circuitry, tuner circuitry, analog-to-digital conversion circuitry, decoding circuitry and so forth. Furthermore, while described herein as circuitry, understand that the various components shown in FIG. 1 and other figures may be implemented as hardware, software, firmware, or combinations thereof. That is, while described herein as a demodulator circuit and an FEC circuit, in some implementations such circuitry may be realized in firmware or software executed by a general-purpose processor, digital signal processor (DSP) or other such processing circuitry.

As shown in FIG. 1, demodulator circuit 20 includes an OFDM front-end and FFT block 22 and an OFDM equalizer 24. Block 22 may perform FFT computations using, for example, FFT calculation circuitry. OFDM equalizer 24 may perform channel estimation and correction. From OFDM equalizer 24, channel-equalized symbols in the form of a data stream are provided to FEC circuitry 30. More particularly, the symbol data are provided to an inner symbol deinterleaver 32 of FEC circuitry 30. In FIG. 1, waveform A illustrates data enables provided to inner symbol deinterleaver 32 as shown at signal A coupled between demodulator circuit 20 and FEC circuitry 30. With respect to the values in waveform A, N is the number of carriers of demodulator 20 (2048, 4096 or 8192 for DVB-T), GI is the number of carrier samples of the guard interval (N/32, N/16, N/8 or N/4 for DVB-T), K is the number of total number of carriers including data, synchronization and signalization carriers (1705, 3409 or 6817 for DVB-T), and M is the number of data carriers (1512, 3024 or 6048 for DVB-T).

Thus as shown in FIG. 1, waveform A includes a given number of null edge carriers which may be a small number of the demodulator carriers (e.g., approximately 8% N). Then a plurality of data, synchronization, and signalization carriers may be transmitted. Note that the number of synchronization/signalization carriers corresponds to K-M. Then additional null edge carriers may be transmitted, followed by a guard interval, which may be a predetermined amount of the demodulator carriers (e.g., up to 25% or N/4). Of course while not shown in waveform A, understand that after the guard interval, succeeding symbols may be transmitted including null carriers, data, synchronization, and signalization carriers, followed by more null carriers and another guard interval.

Because of the variability of the guard interval between different symbols in addition to static jitter, the data rate at which the outgoing data stream is transmitted from demodulator circuit 20 varies. Accordingly, embodiments may provide an inner symbol deinterleaver 32 that provides mechanisms for data rate smoothing, as will be described further below. Waveform B shows the resulting output from inner symbol deinterleaver 32, after data rate smoothing in accordance with an embodiment of the present invention. After deinterleaving, the data stream is provided to a demapper 34 for demapping. Then an inner bit deinterleaver block 36 is encountered, which then provides the bit-deinterleaved data stream to a depuncturer 38, which is coupled to a Viterbi decoder 40. Note that depuncturer 38 is directly coupled to Viterbi decoder 40, without the need for any separate buffering of data therebetween. Thus the need for additional memory such as a first-in-first-out (FIFO) in this part of the FEC path can be avoided, although depuncturer 38 may include minimal buffering to provide temporary storage of approximately 4-5 samples. After Viterbi decoding, the data stream is provided to an outer deinterleaver 42, which in turn is coupled to a Reed-Solomon (RS) decoder 44, which in turn is coupled to a descrambler 46. From descrambler 46, the descrambled data stream may be provided to an interface 48, such as a transport stream interface, e.g., an MPEG-TS interface. Again, note that descrambler 46 is directly coupled to interface 48, without the need for buffering circuitry or byte rate smoothing mechanisms.

Thus by using embodiments of the present invention, other mechanisms for jitter reduction that are typically present at a backend of an FEC circuit, e.g., prior to an interface such as interface 48, may be avoided. Further, by providing data rate smoothing mechanisms at a front end of FEC circuitry, receiver complexity is reduced. Specifically, the need for an extra memory, e.g., FIFO, which has to be able to absorb all prior bursts related to demodulation parameters and synchronization, can be avoided. As noted above, these bursts could last up to twice the guard interval time. In addition to avoiding additional memory needs, the FEC circuitry, and particularly the depuncturing before the Viterbi decoder, can be relieved from suffering from jitter. With the techniques described herein, no output buffer within FEC circuitry is necessary at all, as the memory used for frequency deinterleaving is optimally also used for jitter reduction.

While not shown in FIG. 1 for ease of illustration, a digital phase lock loop (PLL) can be implemented with low-complexity logic, which will maintain under static channel conditions the output jitter to +/− half of the carrier clock cycle. In addition, an algorithm in accordance with an embodiment of the present invention is implemented to dynamically adapt data rate from OFDM symbol to OFDM symbol in order to absorb FFT window jumps due to dynamic channel conditions. Thus using embodiments of the present invention, the reading rate of the OFDM symbol deinterleaving procedure is dynamically adapted to minimize the jitter of the output deinterleaved stream and consequently, the jitter of the MPEG stream at the end of the FEC process.

In various embodiments, a digital PLL is implemented to provide the most regular possible read enable control signal for the deinterleaving procedure. This PLL is controlled by static OFDM parameters such as N, GI, K and M (recall that N is the FFT size, GI is the guard interval size, K is the number of total carriers, and M is the number of data carriers) and by the dynamic echo conditions. The reading procedure is performed in 2 steps: (1) reading of an OFDM symbol (i) begins as soon as the last carrier of the symbol has been written at a rate in accordance with the assumption that N+GI cycles are available to deinterleave M carriers; and (2) the reading rate is updated at arrival time of the next OFDM symbol (i+1), where the update can cause the reading rate to be accelerated, decelerated, or maintained, according to the arrival time.

Figure 2:
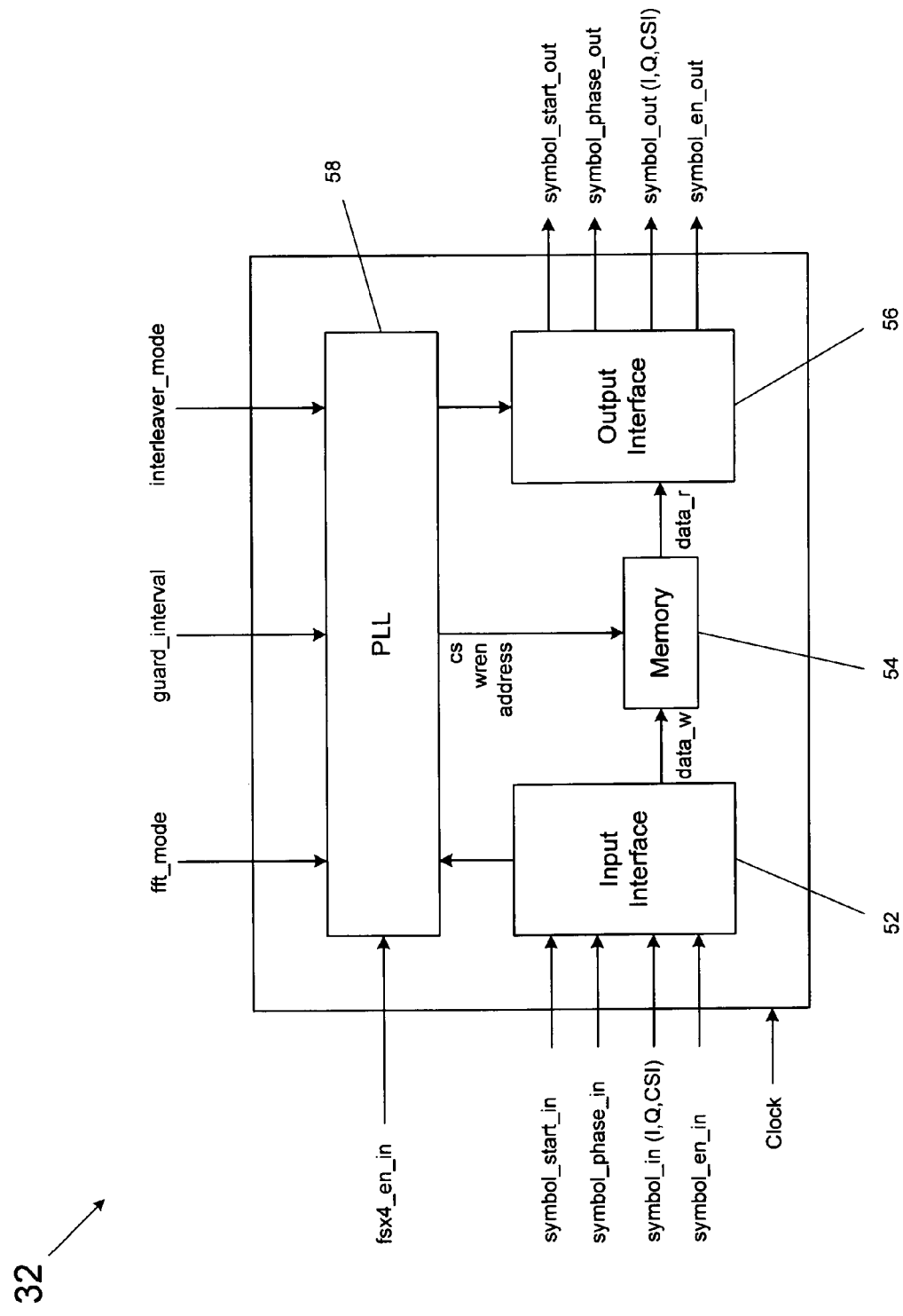
FIG. 2 is a more detailed view of an inner symbol deinterleaver and its interfaces in accordance with one embodiment of the present invention.

Referring now to FIG. 2, shown is a more detailed view of an inner symbol deinterleaver and its interfaces in accordance with one embodiment of the present invention. As shown in FIG. 2, deinterleaver 32, which may correspond to that shown in the block diagram of FIG. 1, includes an input interface 52, a memory 54, an output interface 56, and a PLL 58. As shown in FIG. 2, input interface 52 is coupled to receive the incoming data stream, i.e., symbol_in, along with various control signals. Data is written from input interface 52 to memory 54 under control of PLL 58. In turn, data is read from memory 54 under control of PLL 58. As shown in FIG. 2, outgoing data, i.e., data_r, is provided to output interface 56, which then provides the output symbol data stream, i.e., symbol_out, as well as various control signals. Deinterleaver 32 receives the datapath and control signals from an equalizer such as OFDM equalizer 24 of FIG. 1. The control signals will synchronize read/write (R/W) sequencing of deinterleaver 32, and PLL 58 is used for jitter reduction.

Signals incoming to deinterleaver 32 include "symbol_in," which is the data carrier information and conveys I and Q coordinates of the equalized constellation point plus related Channel State Information (CSI); "symbol_start_in", which is high during the first data carrier of each OFDM symbol; "symbol_phase_in", which carries the symbol number (from 0 to 271) within a given super-frame; "symbol_en_in", which is high to flag the M data carriers; "fsx4_en_in" which is a system clock enable that, combined with the sampling clock "clk", provides a clock "fsx4" having an average frequency that is 4 times the DVB-T symbol frequency, i.e., 4*9.14 MHz for a channel bandwidth of 8 MHz. As shown in FIG. 2, "fsx4 en in"" is used to drive PLL 58.

Symbol deinterleaver 32 is controlled by static signals, which are input into PLL 58, including "fft_mode," which is the size N of the FFT (2K, 4K or 8K); "guard_interval," which is the size of the guard interval and may be at a value of N/32, N/16, N/8 or N/4 in some embodiments; and "interleaver_mode," which is either "native" or "in_depth".

In one embodiment, memory 54 may store a maximum of M=6048 symbols, with each entry in memory 54 being 24 bits. The symbol data stored in memory 54 is used for the deinterleaving process. The same equivalent datapath and control signals provided to symbol deinterleaver 32 via input interface 52 are de-facto retrieved at the deinterleaver output via output interface 56. At the emission, the OFDM symbols are frequency interleaved with 2 different methods, depending on the parity of the symbol number within the OFDM super-frame of 272 symbols. These two addressing methods are defined according to DVB-T ETSI specification EN 300 744, chapter 4.3.4.2. At reception, if the symbols are deinterleaved as set forth below in Table 1, a unique memory of M=6048 symbols is sufficient to implement the deinterleaving function properly.

To effect deinterleaving and jitter reduction using this limited memory, a deinterleaved symbol (i) may be read and an interleaved symbol (i+1) written during the same period of time. Specifically, as shown in Table 1, during a first time period (i.e., period one) a first symbol is read, i.e., corresponding to a last symbol of a previous super-frame (n−1), while at the same time a first symbol of a current frame (i.e., super-frame n) is written. As shown in Table 1, these read and write processes may be performed using a sequential addressing method. During a next time period (i.e., period two) the first symbol is read, while a next symbol (i.e., symbol #1) is written, and so forth. As shown in Table 1, these processes may be performed using a random addressing method.

TABLE 1

| Time Period | Process | Frame Number | Symbol Number | Addressing Method |
|---|---|---|---|---|
| 1 | Read | n − 1 | 271 | Sequential |
|   | Write | n | 0 | |
| 2 | Read | n | 0 | Random |
|   | Write | n | 1 | |

TABLE 1-continued

| Time Period | Process | Frame Number | Symbol Number | Addressing Method |
|---|---|---|---|---|
| 3 | Read | n | 1 | Sequential |
|   | Write | n | 2 | |
| 4 | Read | n | 2 | Random |
|   | Write | n | 3 | |

The "sequential" addressing method (implemented by a "q" counter) means that the carriers of the interleaved (or deinterleaved) symbol are written (or read) at consecutive growing addresses. The "random" addressing method (implemented by a "hq" counter) means that the carriers of the interleaved (or deinterleaved) symbol are written (or read) at "random" addresses, such as may be generated by a pseudo random number generator. The sequence of these addresses may be defined by the permutation law H(q) of the DVB-T ETSI specification.

Figure 3:
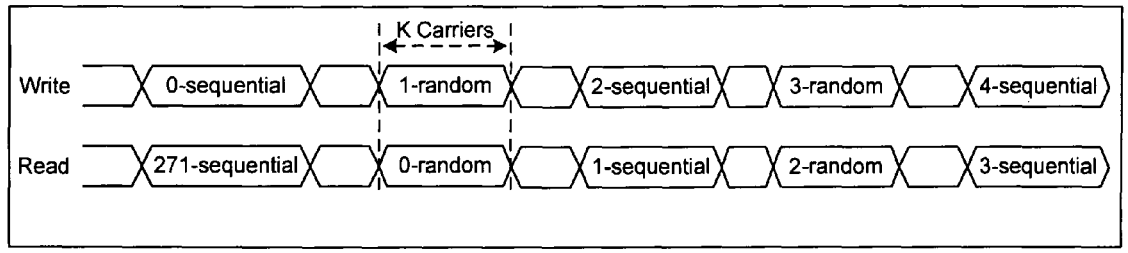
FIG. 3 is a timing diagram of read/write operations during a deinterleaving process.

FIG. 3 shows a conventional manner of sequencing read/write operations during a deinterleaving process. There is no conflict possible between R/W operations because, as seen in FIG. 3, at the same period of time, either a sequential (q) or random (hq) addressing counter is used. The same address is then used for Read and Write, and for a single-port memory, the Read then the Write operations are processed sequentially during 2 system clock cycles (first read carrier of address U) of symbol (i) then write carrier to address U) of symbol (i+1) the cycle afterwards). But in that case, the deinterleaved symbol suffers from the same jitter as the interleaved symbol, with M data deinterleaved carriers being provided during K carrier cycles.

Figure 4:
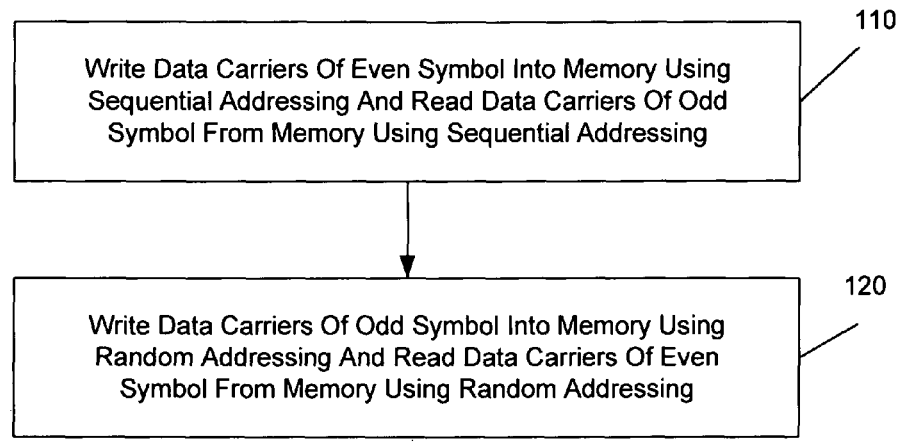
FIG. 4 is a flow diagram of a read/write method in accordance with an embodiment of the present invention.

Referring now to FIG. 4, shown is a flow diagram of a read/write method in accordance with an embodiment of the present invention that enables reduced output jitter. As shown in FIG. 4, method 100 may be used to both write incoming symbols into a deinterleaver memory and to read the stored symbols therefrom. Specifically, method 100 may begin by writing data carriers of an even symbol into the memory using sequential addressing (block 110). At the same time as writing this data, sequential addressing may be used to read data carriers of an odd symbol previously written into the memory. While these read and write operations may be performed at the same time (i.e., during a common time period), note that due to variances in guard intervals, along with other dynamic and static channel conditions, the read and write operations need not necessarily occur absolutely simultaneously. That is, reading of the odd symbol may begin prior to writing of the even symbol, or vice-versa. Also understand that in some implementations based on dynamic channel conditions, the read rate and write rate need not be at a common rate. While not shown in block 110, understand that the stored odd symbol may have been written previously into the memory using random addressing, rather than the sequential addressing used to read the data.

Still referring to FIG. 4, at block 120 data carriers of an odd symbol may be written into the memory using random addressing. At the same time, the data carriers of the previously written even symbol may be read from the memory using random addressing (block 120). In this way, R/W operations may act asynchronously. Furthermore, while method 100 indicates that even symbols are written sequentially and read using random addressing and odd symbols, other implementations are possible.

Figure 5:
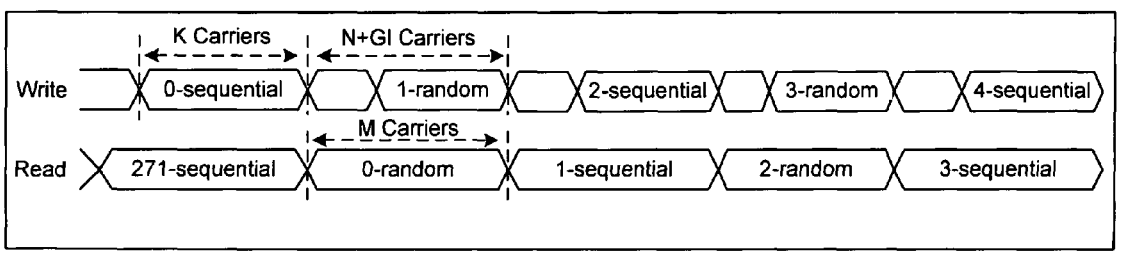
FIG. 5 is a timing diagram of read/write operations during a deinterleaving process in accordance with an embodiment of the present invention.

Referring to FIG. 5, shown is a timing diagram of read/write operations during a deinterleaving process in accordance with an embodiment of the present invention. As shown in FIG. 5, it is possible to take benefit of the memory to reduce the output jitter, by reading the M data carriers of the deinterleaved symbol during the total time available, which is the time between 2 OFDM symbols, usually N+GI carrier cycles. In that case, as R/W operations become somewhat asynchronous, read and write managers may be used, each of them implementing both the sequential (q) and the random (hq) addressing method.

Figure 6:
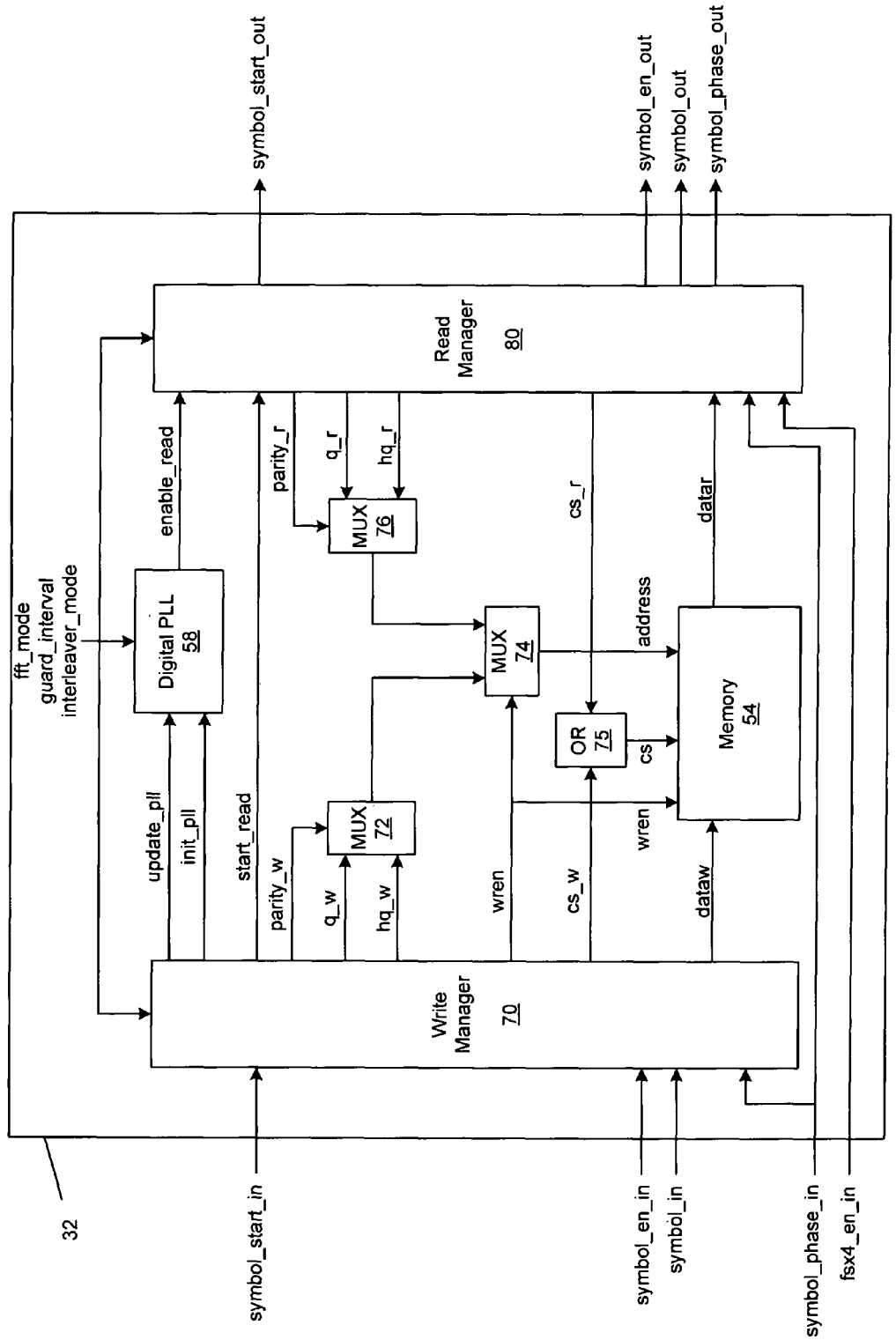
FIG. 6 is a detailed block diagram of a symbol deinterleaver in accordance with an embodiment of the present invention.

Referring now to FIG. 6, shown is a detailed block diagram of a symbol deinterleaver in accordance with an embodiment of the present invention. As shown in FIG. 6, deinterleaver 32, which may correspond to deinterleaver 32 of FIGS. 1 and 2 may include, in addition to memory 54 and PLL 58, a write manager 70 and a read manager 80. In various embodiments, write manager 70 may be implemented within input interface 52 (shown in FIG. 2) and read manager 80 may be integrated within output interface 56 (shown in FIG. 2). As shown in FIG. 6, write manager 70 receives various control signals, which it uses to provide control information to PLL 58, memory 54, as well as a multiplexer 72, which is controlled to provide an output to select either sequential addressing or pseudo-random addressing. In turn, the output of multiplexer 72 is provided to a multiplexer 74, which also receives the output of another multiplexer 76, controlled by read manager 80. As described further below, read manager 80 controls multiplexer 76 to also select either sequential addressing or pseudo-random addressing. Under control of write manager 70, multiplexer 74 provides the selected address to memory 54. Still further, an OR gate 75 is controlled by inputs from write manager 70 and read manager 80 to provide a select signal to memory 54.

In one embodiment, the R/W mechanism is as follows: on even input symbols (parity_w=0) sequential addressing (q_w) is used by write manager 70 and on odd input symbols (parity_w=1) pseudo-random addressing (hq_w) is used; and on even output symbols (parity_r=0), pseudo-random addressing (hq_r) is used by read manager 80 and on odd output symbols (parity_r=1) sequential addressing (q_r) is used.

The interleaved symbol (i) is written, by burst, according to the data enable input "symbol_en_in", which is active during M cycles within the (N+GI) cycles of the OFDM symbol. The symbol (i) starts to be deinterleaved once it is finished being written (start_read=1). The deinterleaving rate may be tuned to the total time available before the start of the next symbol (i+1), i.e., M data are to be deinterleaved during N+GI cycles. In various embodiments, this tuning is done by PLL 58, which delivers to read manager 80 a control signal "enable_read" to regulate the reading process, de-facto minimizing the jitter of the deinterleaved stream. As described above, the static parameters used to control PLL 58 are "fft_mode", "guard_interval" and "interleaver_mode". Through these parameters, the values of N, M, K and GI are known. One algorithm used for digital PLL 58 is detailed below.

Additional jitter may occur because of synchronization, which might involve sudden jumps of the FFT window start signal (on the order of magnitude of +/− GI). As a result, the time between 2 OFDM symbols is not constant and could vary from one symbol to another. To accommodate this jitter, the reading procedure may be as follows: (1) as soon as the last data carrier of symbol (i) is written, the reading procedure starts (start_read=1) with the assumption that N+GI cycles are available to read the M data (i.e., according to a "normal" reading ratio of (M/(N+GI))). PLL 58 is initialized when init_pll=1, and in consequence of that, the reading procedure occurs at normal speed; and (2) when the first carrier of next input symbol (i+1) is present, PLL 58 knows how many carriers from symbol (i) have already been deinterleaved (nb_data_read) and how many carriers from symbol (i) are remaining to be read (M-nb_data_read). Note that these signals may be generated in read manager 80 responsive to the number of carriers read from memory 54. This remaining number of carriers has to be read before the end of the write process of the symbol (i+1). Accordingly, PLL 58 will be updated when update_pll=1.

Figure 7:
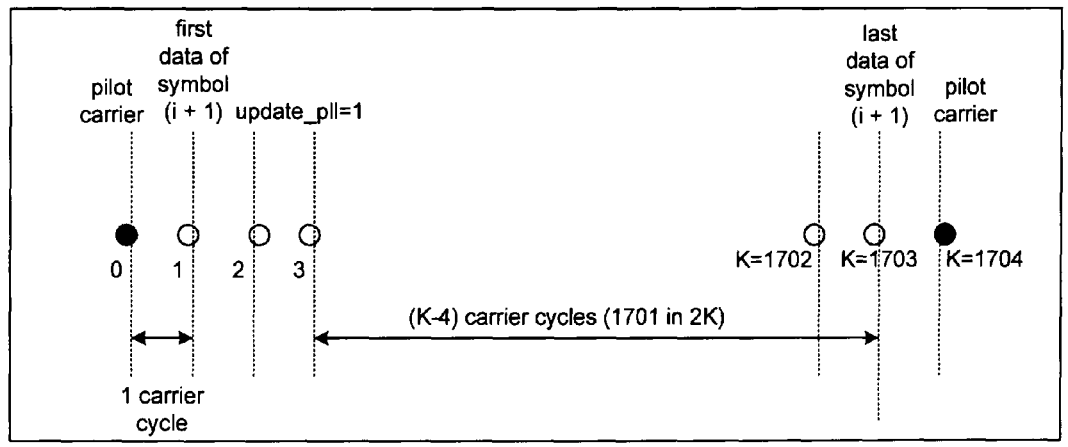
FIG. 7 is a timing diagram of an update operation in accordance with one embodiment of the present invention.

The time remaining between the update of PLL 58 and the end of the input symbol (i+1) is always deterministic and fixed. It is equal to (K−4) carrier cycles as shown in FIG. 7, which is a timing diagram showing the remaining available time when a PLL update occurs. As shown in FIG. 7, a next incoming symbol (i.e., symbol (i+1)) is received that includes a first pilot carrier, and at a next carrier cycle, the first data carrier of the symbol is received and stored in the memory. Upon storage of this first data symbol, write manager 70 initiates the update pll signal (shown at carrier cycle 2). Note that the deterministic time of (K−4) carrier signals thus exists before the last data carrier of symbol (i+1) is written at carrier number 1703 (in 2K mode), which is then followed by a terminating pilot carrier of symbol (i+1). Once PLL 58 is updated, the reading procedure will occur either at normal, slower or faster speed (i.e., (K−4)/remaining number of M carriers of symbol (i) to be read), depending on the arrival time of symbol (i+1), as shown for example in the timing diagram of FIG. 8.

Figure 8:
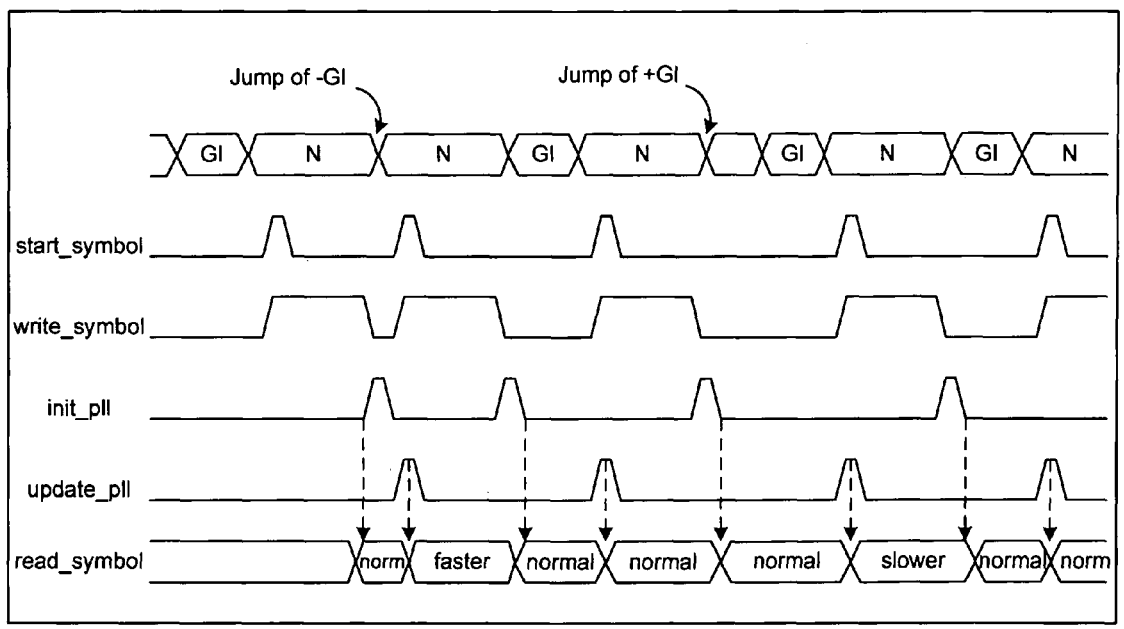
FIG. 8 is a timing diagram of various signals in accordance with one embodiment of the present invention.

As shown in the timing diagram of FIG. 8, the incoming data stream includes multiple symbols N, some of which include a guard interval of GI therebetween, some of which are possibly followed immediately by another data symbol without a guard interval (or a varying size guard interval less than GI), and some of which are followed by a varying size guard interval greater than GI. As shown in FIG. 8, the first data carrier of a symbol causes initiation of the "start_symbol" signal which in turn initiates a "write_symbol" signal, which may begin write operations into the deinterleaver memory. Immediately at the conclusion of writing data of a given symbol, a PLL initiation signal ("init_pll") is generated to initiate reading of data for the corresponding symbol. Note that such initiation signal causes initiation of reading of the symbol according to a "read_symbol" signal, which may always be initiated at the normal read rate. When a first data carrier of a following symbol is received, the PLL may determine an updated read rate responsive to an "update_pll" signal to cause reading of the previous symbol to occur at the updated rate which, as described above, may be its normal rate, slower or faster depending on arrival time of the next symbol. While shown with this particular implementation in the embodiment of FIG. 8, the scope of the present invention is not limited in this regard.

Figure 9:
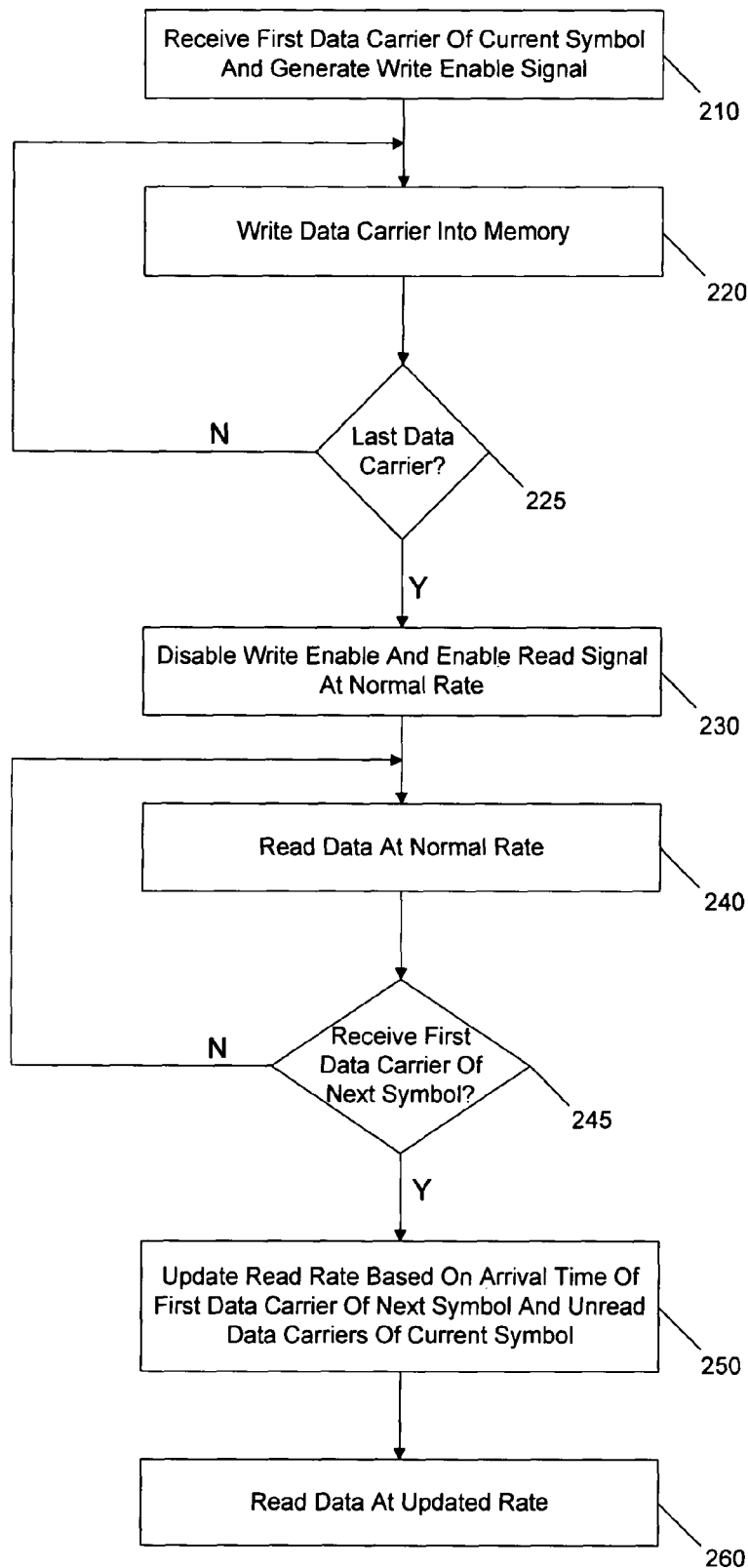
FIG. 9 is a flow diagram of a method for reducing output data stream jitter from a deinterleaver in accordance with an embodiment of the present invention.

Referring now to FIG. 9, shown is a flow diagram of a method for reducing output data stream jitter from a deinterleaver in accordance with an embodiment of the present invention. As shown in FIG. 9, method 200 may begin by receiving a first data carrier of a current symbol in the deinterleaver (block 210). Responsive to this first data carrier, a write enable signal may be generated to enable writing of the data carrier into the deinterleaver memory. Control passes to block 220 where the data carrier may be written into the memory. Then it may be determined whether this data carrier is the last data carrier of the symbol (diamond 225). If not, control passes back to block 220 in an iterative manner such that the incoming data carriers of a given symbol are written into the memory. As described above, depending on a parity of the symbol (i.e., odd or even) the data carriers may be written into the memory using sequential or random addressing. While not described in FIG. 9, understand that data carriers of a previous symbol may be read from the memory while the write operations for the current symbol occur.

Referring still to FIG. 9, when a last data carrier is written into the memory, control passes to block 230. At block 230 the write enable signal may be disabled and a read enable signal may be generated at a normal rate. For example, a digital PLL may generate a read enable signal to initiate reading of the data carriers of the symbol which just completed being written into the memory. The normal rate may correspond to the assumed time available, namely N+GI, divided by the total number of data carriers M. Control next passes to diamond 245 where it may be determined whether a first data carrier of a next symbol has been received. If not, data continues to be read at the normal data rate iteratively.

When the first data carrier of the next symbol is received, control passes to block 250 where the read rate may be updated. More specifically, the read rate may be updated based on the arrival time of the first data carrier of the next symbol and the remaining data carriers of the current symbol. That is, a deterministic time equal to K−4 exists until the last data carrier of the next symbol is written into the memory, and the digital PLL knows the remaining number of data carriers of the current symbol to be read. Thus an updated data rate may be generated. Accordingly, control passes to block 260, where further reading of the data carriers of the current symbol may occur at this updated data rate. While shown with this particular implementation in the embodiment of FIG. 9, the scope of the present invention is not limited in this regard.

Note that in some embodiments, the sampling rate $F_s$, may be as follows:

$$F_S = \frac{64}{7} \text{ MHz} = 9.14 \text{ MHz for } B_W = 8 \text{ MHz}.$$

The theoretical non-jittered data clock to read the deinterleaver is at the normal rate:

$$F_{ideal} = F_s * \frac{P}{Q} \quad \text{[EQ. 1]}$$

where P is the number of data cycles, Q is the number of total cycles, and $F_s$ is the carrier clock recovered by time synchronization, also "affected" from very low-jitter, as it is a gated clock from system clock "clk." Table 2 shows P and Q values for all DVB-T scenarios.

TABLE 2

| FFT | GI | Number of Data cycles per symbol (P = M) | Number of Total cycles per symbol (Q = N + GI) |
|---|---|---|---|
| 2K | 1/4 | 1512 | 2560 |
|  | 1/8 |  | 2304 |
|  | 1/16 |  | 2176 |
|  | 1/32 |  | 2112 |
| 4K | 1/4 | 3024 | 5120 |
|  | 1/8 |  | 4608 |
|  | 1/16 |  | 4352 |
|  | 1/32 |  | 4224 |
| 8K | 1/4 | 6048 | 10240 |
|  | 1/8 |  | 9216 |
|  | 1/16 |  | 8704 |
|  | 1/32 |  | 8448 |

In one implementation, the following algorithm may be employed by PLL 58 to control reading/writing of symbol data to/from the deinterleaver memory. This algorithm may obtain from the quasi-regular clock $F_s$ a punctured clock, $F_p$, which is as near as possible to the theoretical non-jittered clock $F_{ideal}$. $F_p \approx F_{ideal}$, when comparing average frequencies, however, $F_p$ gets an additional jitter equal, in static conditions, to half a period of clock $F_s$ (~50 ns), which is very small. The enable for reading sequence, active high, is defined by the following algorithm. As shown in the algorithm of Table 3 when reading of a symbol is initiated, the reading rate may be in accordance with a reading ratio of p/q, which is at a value of M/(N+GI) at a beginning of the reading. When an update occurs, the reading ratio is still in accordance with p/q, although at this time this ratio corresponds to (M-nb_data_read)/(K−4). Note that the value of Delta, as used in Table 3, is an internal counter for the PLL algorithm which determines whether the read enable signal (i.e., En(i)) is active (i.e., at a value of one).

TABLE 3

▸ PLL init:      PLL update:
     p = M      p = M - nb_data_read
     q = N + GI      q = K - 4

▸ Start of OFDM symbol:
     i = 0     Delta(0) = 0     En(0) = 1

▸ At each carrier cycle (i) of Fs:
  • Compute Delta(i) such as:

If En(i - 1) = 1 Then Delta(i) = Delta(i - 1) + (q - p)
                Else Delta(i) = Delta(i - 1) - p

• Compute En(i) such as:

If Delta(i) > $\frac{p}{2}$ Then En(i) = 0 Else En(i) = 1

The range of Delta is $\left[ -\left(\frac{P}{2}\right); \; Q - \left(\frac{P}{2}\right) - 1 \right]$.

Figure 10:
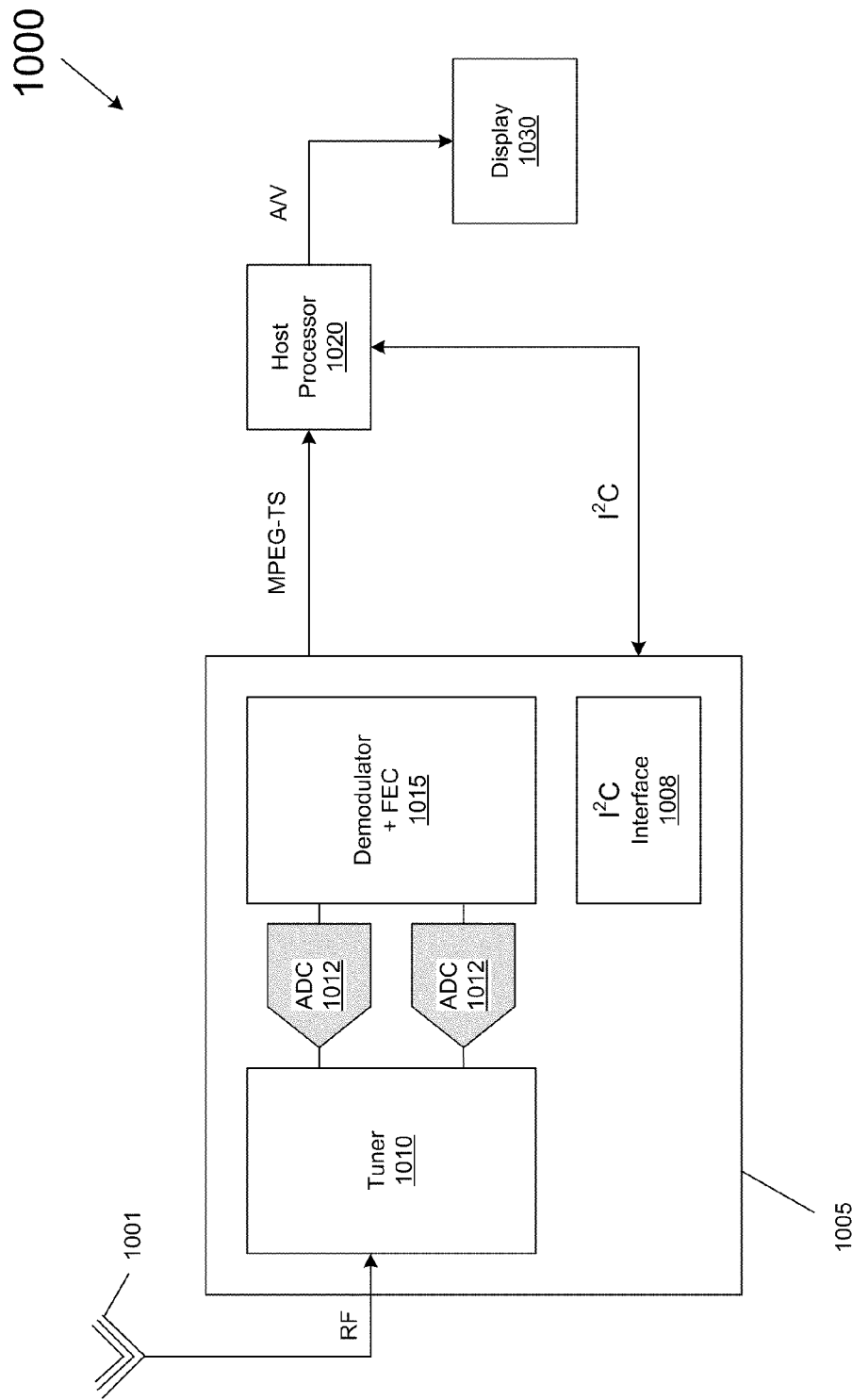
FIG. 10 is a block diagram of a system in accordance with one embodiment of the present invention.

Embodiments may be implemented in many different system types, such as set-top boxes, high definition or standard digital terrestrial televisions, and so forth. Some applications may be implemented in a mixed signal circuit that includes both analog and digital circuitry. Referring now to FIG. 10, shown is a block diagram of a system in accordance with one embodiment of the present invention. As shown in FIG. 10, system 1000 may include a television that is coupled to receive a RF signal from an antenna source 1001 such as an over-the-air antenna 1001. However, in other embodiments, the original source may be cable distribution, satellite, or other source that is then redistributed through a digital terrestrial network. The incoming RF signal may be provided to a front end device 1005 which may be, in one embodiment a single-chip mixed signal device. Front end device 1005 may incorporate embodiments of the present invention to provide improved jitter rate reduction while consuming low power and area.

Referring still to FIG. 10, front end device 1005 may include a tuner 1010 and a demodulator 1015 that may include FEC circuitry. More specifically, the incoming RF signal is provided to a tuner 1010 for tuning to a desired signal channel. While the scope of the present invention is not limited in this regard, tuner 1010 may include various circuitry. For example, in one embodiment tuner 1010 may include a bandpass filter having an output coupled to a low noise amplifier (LNA) to receive and amplify the RF signal. The output of the LNA may be provided to another bandpass that in turn is coupled to a mixer. In turn, the mixer downconverts the incoming RF signal to a complex IF output, which may be digitized by analog-to-digital converters (ADCs) 1012, to provide a desired signal channel.

Referring still to FIG. 10, the digitized output of ADCs 1012 may be provided to additional processing circuitry including demodulator 1015 which may be the demodulator and FEC circuitry shown in FIG. 1. The output of demodulator 1015 may correspond to a transport stream such as an MPEG-TS that is provided to a host processor 1020 for further processing into an audio visual signal that may be provided to a display 1030, such as a computer monitor, flat panel display or other such display. Note further, a control channel which may be in accordance with an $I^2C$ communication path may be present between host processor 1020 and front end device 1005. Accordingly, front end device 1005 may include an $I^2C$ interface 1008 to enable communication along this path.

While shown with this particular implementation in the embodiment of FIG. 10, it is to be understood the scope of the present invention is not limited in this regard. Furthermore, it is to be understood that embodiments may be implemented in many different devices, such as receivers, transmitters and so forth. Still further, control logic, program storage or other computer readable media may be present to store instructions that when executed within demodulator 1015 to perform jitter control.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A deinterleaver comprising:
an input interface to receive orthogonal frequency division multiplexing (OFDM) symbols from a demodulator;
a memory coupled to the input interface to store the OFDM symbols received from the input interface;
an output interface coupled to the memory to receive the OFDM symbols stored in the memory; and
a digital phase lock loop (PLL) coupled to the input interface and the output interface, the digital PLL to control and adjust a reading rate of the output interface responsive to dynamic and static channel conditions of a channel that transmits the OFDM symbols.

2. The deinterleaver of claim 1, wherein the digital PLL is to receive control signals from the input interface and adjust the reading rate further responsive to the control signals and a plurality of static signals corresponding to an operation mode.

3. The deinterleaver of claim 2, wherein the digital PLL is to control output jitter of the OFDM symbols read from the memory based on control of the reading rate.

4. The deinterleaver of claim 3, wherein the digital PLL is to control the output jitter to less than half of a carrier clock cycle under a static channel state.

5. The deinterleaver of claim 4, wherein the digital PLL is to control the output jitter to dynamically adapt the reading rate under a dynamic channel state to absorb a fast Fourier transform (FFT) window jump.

6. The deinterleaver of claim 3, wherein the digital PLL is to initiate the reading rate at a first frequency and update the reading rate to a second frequency based on an arrival time of a next OFDM symbol.

7. The deinterleaver of claim 6, wherein the digital PLL is to set the first frequency based on a sum of a number of carriers for the demodulator and a number of carriers for a guard interval, and the second frequency based on the arrival time of the next OFDM symbol and a remaining number of carriers of a current OFDM symbol to be read from the memory.

8. The deinterleaver of claim 1, wherein the deinterleaver is located at an input stage of forward error correction (FEC) logic coupled to an output of the demodulator.

9. The deinterleaver of claim 8, wherein the FEC logic includes:
a depuncturer directly coupled to a decoder, without an intervening memory; and
a transport stream interface to provide a data stream to a processor, wherein an input of the transport stream interface is directly coupled to a descrambler without an intervening memory.

10. The deinterleaver of claim 1, further comprising:
a first selection logic coupled to the input interface to select sequential addressing or pseudo random addressing for writing of the OFDM symbols to the memory, the first selection logic controlled by the input interface;
a second selection logic coupled to the output interface to select the sequential addressing or the pseudo random addressing for reading of the OFDM symbols from the memory, the second selection logic controlled by the output interface; and
a third selection logic to receive an output of the first and second selection logic and to provide an address signal to the memory.

11. A method comprising:
writing symbol data of a first parity into a memory using sequential addressing and writing symbol data of a second parity into the memory using pseudo random addressing;
reading symbol data of the first parity from the memory using the pseudo random addressing and reading symbol data of the second parity from the memory using the sequential addressing;
reading symbol data of a first symbol from the memory after all of the symbol data of the first symbol is written into the memory, wherein symbol data of a second symbol is written into the memory while reading the symbol data of the first symbol, and
initiating a reading rate for reading the symbol data of the first symbol at a first frequency upon writing of a last symbol data of the first symbol into the memory, the first frequency based on a sum of a number of carriers for a demodulator and a number of carriers for a guard interval.

12. The method of claim 11, further comprising updating the reading rate for reading the symbol data of the first symbol to a second frequency upon writing of a first symbol data of the second symbol into the memory, the second frequency based on the arrival time of the second symbol and a remaining number of carriers of the first symbol to be read from the memory.

13. The method of claim 12, wherein the second frequency is higher than the first frequency if the second symbol follows the first symbol with a guard interval less than a predetermined guard interval, and is lower than the first frequency if the second symbol follows the first symbol with a guard interval greater than the predetermined guard interval.

14. The method of claim 11, further comprising beginning the reading of the symbol data of the first symbol responsive to a control signal from a digital PLL, wherein the control signal is generated responsive to an initiate signal indicative of completion of writing the first symbol into the memory.

15. The method of claim 14, further comprising updating the reading of the symbol data of the first symbol responsive to a second control signal from the digital PLL, wherein the second control signal is generated responsive to a start signal indicative of beginning of writing the second symbol into the memory.

16. The method of claim 11, wherein the reading and the writing occur asynchronously.

17. The method of claim 11, further comprising transmitting the symbol data of the first and second parity to a depuncturer, depuncturing the symbol data in the depuncturer, transmitting the depunctured symbol data from the depuncturer to a decoder, transmitting decoded symbol data to a descrambler, and transmitting descrambled symbol data directly to a transport stream interface, without buffering the descrambled symbol data.

18. A system comprising:
a tuner to receive a radio frequency (RF) signal from a signal source, and downconvert the RF signal to a second frequency to extract a signal channel from the RF signal;
a demodulator coupled to the tuner to demodulate the signal channel;
a forward error correction (FEC) circuit coupled to the demodulator to receive the demodulated signal channel and to generate a transport stream therefrom, the FEC circuit including a front end stage, a decoding stage and a back end stage, wherein the front end stage includes a digital phase lock loop (PLL) coupled to a memory to store demodulated symbol data, the digital PLL to control and adjust a reading rate from the memory responsive to dynamic and static channel conditions of the system; and
a processor coupled to the FEC circuit to receive the transport stream and to process the transport stream to obtain audio visual data.

19. The system of claim 18, wherein the digital PLL is to initiate the reading rate at a first frequency when a first demodulated symbol has been written into the memory and update the reading rate to a second frequency based on an arrival time of a second demodulated symbol to be written into the memory.

20. The system of claim 19, wherein the digital PLL is to set the first frequency based on a sum of a number of carriers for the demodulator and a number of carriers for a guard interval, and the second frequency based on the arrival time of the second demodulated symbol and a remaining number of carriers of the first demodulated symbol to be read from the memory.

21. The system of claim 20, wherein the front end stage is to begin the reading of the first demodulated symbol responsive to a control signal from the digital PLL, wherein the control signal is generated responsive to an initiate signal indicative of completion of writing the first demodulated symbol into the memory.

22. The system of claim 21, wherein the front end stage is to update the reading rate of the first demodulated symbol responsive to a second control signal from the digital PLL, wherein the second control signal is generated responsive to a start signal indicative of beginning of writing the second demodulated symbol into the memory.

23. The system of claim 18, wherein the front end stage is to write a demodulated symbol of a first parity into the memory using sequential addressing and write a demodulated symbol of a second parity into the memory using pseudo random addressing, and read the demodulated symbol of the first parity from the memory using the pseudo random addressing and read the demodulated symbol of the second parity from the memory using the sequential addressing.

* * * * *